US012776385B2

(12) United States Patent
Kaynak et al.

(10) Patent No.: US 12,776,385 B2
(45) Date of Patent: Oct. 27, 2026

(54) RELIABILITY ENABLED HARD INFORMATION DECODER

(71) Applicant: MICRON TECHNOLOGY, INC., Boise, ID (US)

(72) Inventors: Mustafa N. Kaynak, San Diego, CA (US); Mariano Burich, San Diego, CA (US); Eyal En Gad, Fremont, CA (US); Patrick R. Khayat, San Diego, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/913,733

(22) Filed: Oct. 11, 2024

(65) Prior Publication Data

US 2026/0105981 A1 Apr. 16, 2026

(51) Int. Cl.
*G11C 29/44* (2006.01)

(52) U.S. Cl.
CPC .................................... *G11C 29/44* (2013.01)

(58) Field of Classification Search
None
See application file for complete search history.

(56) References Cited

U.S. PATENT DOCUMENTS

2015/0169406 A1* 6/2015 Li ........................ G06F 11/1012 714/763
2019/0260394 A1* 8/2019 Motwani ............. H03M 13/658

* cited by examiner

*Primary Examiner* — Guerrier Merant
(74) *Attorney, Agent, or Firm* — Lowenstein Sandler LLP

(57) ABSTRACT

A system and method are disclosed for decoding hard data from a memory device. For example, a controller converts the hard data into soft information. The controller decodes the hard data using a first decoder for a first number of decoding iterations to provide an error vector indicating which bits of the hard data have been flipped by the first decoder Bit reliability information indicating a reliability of each bit in a current state of a codeword for a respective decoding iteration of the first number of decoding iterations can be generated from the first decoder, even if errors were not fully corrected. The controller decodes using a second decoder to correct the errors in the hard data for a second number of decoding iterations based on the error vector and the bit reliability information. The controller provides corrected data in response to correcting the errors in the hard data.

20 Claims, 4 Drawing Sheets

RELIABILITY ENABLED HARD INFORMATION DECODER

TECHNICAL FIELD

This disclosure relates to a reliability enabled hard information decoder.

BACKGROUND

A memory sub-system includes a memory device designed for data storage. These memory devices are implemented as non-volatile and volatile memory devices in various examples. In some such examples, a host system employs a memory sub-system for the purposes of storing data on the memory devices and for retrieving data from the memory devices. Not-AND (NAND) flash memory is a type of non-volatile storage technology used in electronic devices and computers for data storage. In NAND flash memory, data is stored in memory cells that can hold electrical charges, representing data bits. Error Correction Codes (ECC), such as Low-Density PC (LDPC) codes are used to correct errors that occur during a reading and writing processes of memory cells of memory devices, such as NAND memory devices.

DETAILED DESCRIPTION

Figure 1:
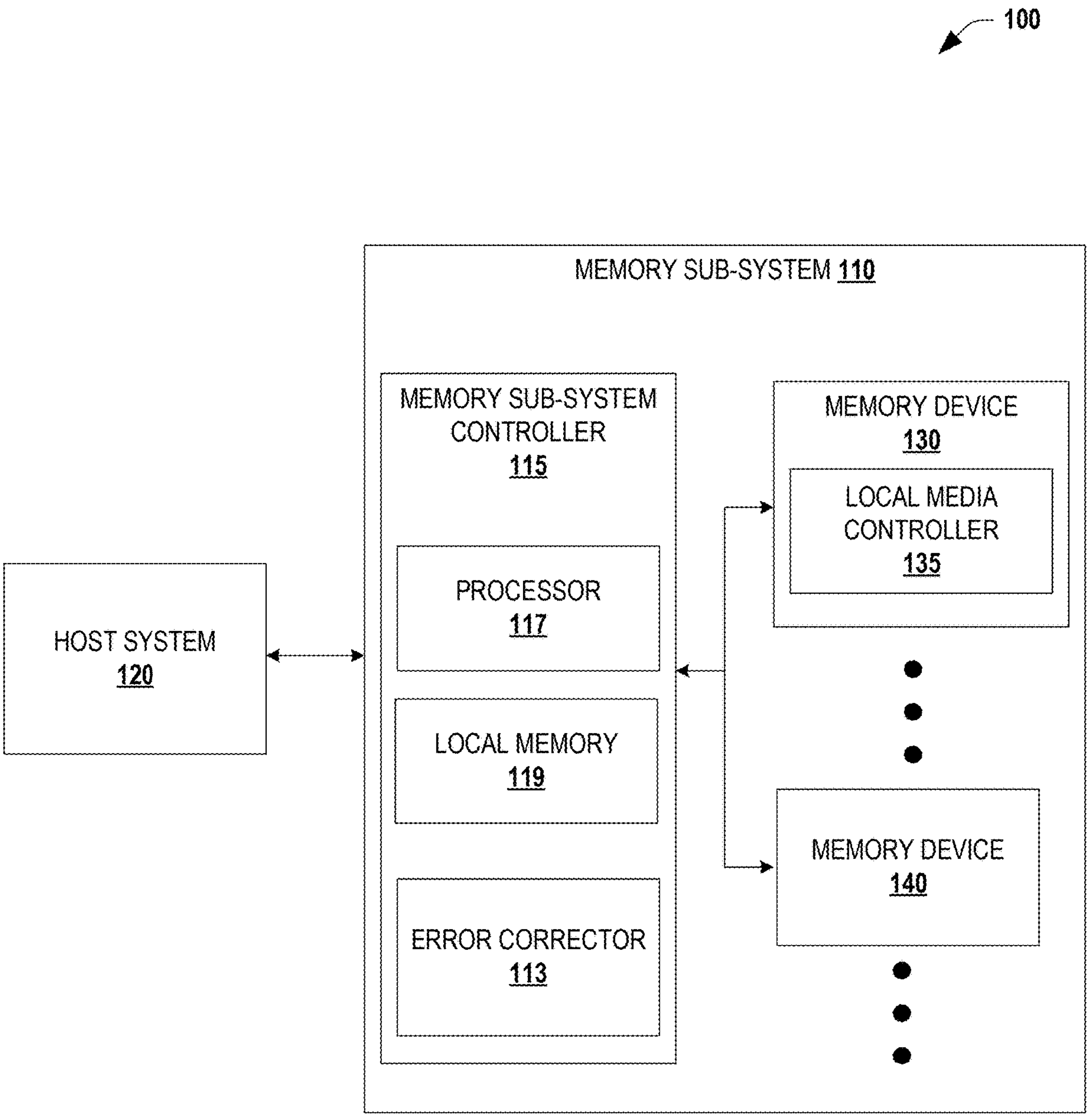
FIG. 1 illustrates an example computing system that includes a memory sub-system in accordance with some examples of the present disclosure.

This disclosure relates to decoding hard data using a reliability enabled hard information decoder based on an error vector and bit reliability information provided by a soft information decoder based on hard information from NAND. In some examples, the present disclosure addresses the challenges of effectively correcting errors in codewords stored in memory devices in complex error scenarios where existing hard information decoders struggle or fail to correct errors, such as in mobile device and enterprise system applications. In some examples, a two stage decoding process is used. In a first stage, a soft information decoder performs initial error correction using hard information to generate an error vector. The soft information is then computed based on hard data corresponding to an originally read codeword and thus can be referred to as computed soft information herein. The error vector identifies one or more bits that have been flipped in the originally read codeword.

For example, the error vector can be generated using reliability measures (e.g., log-likelihood ratio (LLR) values, etc.) for a current state of the codeword after a predefined number of decoding iterations at the first stage. During the first stage, bit reliability information is also generated based on the reliability measures indicative of a bit strength (e.g., weak or strong) of each bit of the current state of the codeword. In a second stage, the reliability enabled hard information decoder uses the error vector and the bit reliability information provided by the soft information decoder for bit-flipping decisions. The two stage decoding process improves error correction efficiency and correction of errors in complex error scenarios while reducing a codeword error rate (CWER) and latency at a given raw-bit-error-rate (RBER) without requiring additional hardware resources.

A memory sub-system refers to a storage device, a memory module or some combination thereof. The memory sub-system includes a memory device or multiple memory devices that store data. The memory devices could be volatile or non-volatile devices. Some examples of a memory sub-system include high density non-volatile memory devices where retention of data is desired during intervals of time where no power is supplied to the memory device. One example of non-volatile memory devices is a Not-AND (NAND) memory device. A non-volatile memory device is a package that includes a die(s). Each such die can include a plane(s). For some types of non-volatile memory devices (e.g., NAND memory devices), each plane includes a set of physical blocks and each physical block includes a set of pages. Each page includes a set of memory cells, which are commonly referred to as cells. A cell is an electronic circuit that stores information. A cell stores at least one bit of binary information and has various logic states that correlate to the number of bits being stored. The logic states are represented by binary values, such as "0" and "1", or as combinations of such values, such as "00", "01", "10" and "11".

A memory device includes multiple cells arranged in a two-dimensional or a three-dimensional grid. In some examples, memory cells are formed on a silicon wafer in an array of columns connected by conductive lines (also referred to as bitlines, or BLs) and rows connected by conductive lines (also referred to as wordlines or WLs). A wordline has a row of associated memory cells in a memory device that are used with a bitline or multiple bitlines to generate the address of each of the memory cells. The intersection of a bitline and a wordline defines an address of a given memory cell.

A block refers to a unit of the memory device used to store data. In various examples, the unit could be implemented as a group of memory cells, a wordline group, a wordline or as individual memory cells. Multiple blocks are grouped together to form separate partitions (e.g., planes) of the memory device to enable concurrent operations to take place on each plane. A solid-state drive (SSD) is an example of a memory sub-system that includes a non-volatile memory device(s) and a memory sub-system controller to manage the non-volatile memory devices.

The memory sub-system controller is configured/programmed to encode the host and other data, as part of a write operation, into a format for storage at the memory device(s). Encoding refers to a process of generating parity bits from embedded data (e.g., a sequence of binary bits) using an error correction code (ECC) and combining the parity bits to the embedded data to generate a Low Density Parity-Check (LDPC) codeword. LDPC encoding refers to an encoding method that utilizes an LDPC code to generate the parity bits, which can be referred to as a parity codeword. User data (e.g., embedded data) is combined with the parity codeword to form the LDPC codeword, which may alternatively be referred to simply as a codeword.

The LDPC code is defined by, among other things, a sparse PC matrix, alternatively referred to as an H matrix, denoted as $\overline{H}$. Each row of the H matrix embodies a linear constraint imposed on a designated subset of data bits. Entries within the H matrix, either "0" or "1", signify a participation of individual data bits in each constraint. Stated differently, each row of the H matrix represents a PC equation and each column corresponds to a bit in the codeword. During encoding, using the user data (embedded data) along with either the H matrix or a generator matrix (an inverse of the H matrix parity bits) are generated to provide a parity codeword. The generated parity codeword is appended to the user data to generate the codeword (LDPC codeword). Thus, the LDPC codeword includes the user data and the parity codeword, allowing for identification and rectification of errors. The LDPC codeword is storable at the memory device(s) of the memory sub-system.

Additionally, the memory sub-system controller can decode codewords, as part of a read operation, stored at the memory device(s) of the memory sub-system. Decoding refers to a process of reconstructing the original user data (e.g., sequence of binary bits embedded in the codeword) from the codeword received from storage at the memory device(s). LDPC decoding refers to a decoding method that utilizes the LDPC code to reconstruct the original user data (embedded data).

A CWER refers to a metric used to quantify a correction capability of a decoding algorithm for implementing a decoding process. Stated differently, CWER reflects a number of codewords out of a collection of codewords that have at least one bit error after the decoding process. A lower CWER implies better decoding performance and higher reliability, while a higher CWER suggests that the decoding algorithm may struggle to effectively correct errors. With respect to using hard information (hard bits) with the decoding algorithm, CWER is functionally dependent on a raw-bit-error-rate (RBER), which is a raw measure of bit errors occurring in an absence of any correction.

Hard information decoders are resource-efficient systems designed to correct errors in the codeword read from a memory device. These decoders employ a bit-flipping algorithm (as part of its decoding algorithm), which iteratively corrects errors by flipping bits in the codeword based on PC violations. In some instances, this codeword is referred to as an originally read codeword. The bit-flipping algorithm operates by evaluating the number of violated PC equations for each bit in the codeword. If the number of violations exceeds a predetermined (or selected) bit-flipping threshold for a current decoding iteration, the algorithm flips that bit. This process repeats until the codeword satisfies the PC conditions or a maximum number of iterations is reached.

A decision process of the bit-flipping algorithm, such as selection of bit-flipping thresholds for evaluation with PC violations at one or more decoding iterations, can be influenced or guided by bit flipping criteria. In some implementations, hard information decoders use matching criteria as part of the bit flipping criteria to impact the decision-making process of the bit-flipping algorithm. The matching criteria influence the algorithm by guiding which bits are considered for flipping and whether the flipping thresholds are adjusted. The term match criteria refers to conditions used to determine whether a current state of a bit matches its originally read state from the memory device. For example, for the matching criteria, a bit's current state of a current state of a codeword can be compared to a state of that bit as it was originally read from the memory device to determine whether a match or mismatch scenario exists. A match scenario occurs when the bit's current state is the same as its originally read state, whereas a mismatch scenario occurs when the bit's current state differs from the originally read state. Thus, the match criteria influences a decoding process by causing different sets of bit-flipping thresholds to be used in a bit-flipping decision at one or more decoding iterations of the decoding process. The term "set," as used herein, may refer to either a single instance of an object or multiple instances of an object, for example, a bit-flipping threshold.

In some instances, the hard information decoders uses two bit-flipping thresholds to decide whether to flip a bit: one for a match scenario and another for a mismatch scenario. For example, during decoding with a hard information decoder, if a bit is connected to more than K number of unsatisfied check nodes, the bit may be flipped by the hard information decoder based on a bit-flipping threshold specific to either the match or mismatch scenario. For instance, if bit k is in a mismatch state and is connected to three unsatisfied check nodes, it will be flipped if the corresponding mismatch-specific bit-flipping threshold is exceeded.

Some hard information decoders can use bit soft information (e.g., bits that encode a strength of a bit as weak or strong) in combination with the matching criteria in its bit decision flipping process. The bit soft information can provide a confidence level (or reliability) indicative of whether a bit is strong or weak independent of its bit value (whether 0 or 1). A weak bit refers to a bit in a current state of the codeword where there is low confidence in its accuracy, hence classified as weak. For example, a weak bit is a bit for which there is a low confidence or probability in that bits value. The confidence or probability (or bit uncertainty) can be represented by an additional bit or value, such as "0" for low confidence bits and "1" for high confidence bits, or vice-versa. In contrast, a strong bit refers to a bit where there is high confidence in its accuracy, hence classified as strong. The hard information decoder uses the bit soft information and the matching criteria in its decision process to select or identify bit-flipping threshold for determining whether a bit should be flipped. For example, if bit k is classified as weak and is in a mismatch state, the bit may be flipped by the hard information decoder using a bit-flipping threshold of bit-flipping thresholds identified for mismatch and weak scenarios. For example, the bit soft information can be provided in response to a read operation performed by the memory device.

For example, the memory device can perform read operations, such as hard reads (1H) and/or soft reads (1H1S, 1H2S, etc). A "hard bit" in this context is a binary read of data where each bit is read and immediately interpreted as either a "0" or a "1", based on a fixed threshold, a Hard Read Position, HRP, that is based on a distribution of threshold voltages of the memory device. For example, in NAND flash memory, a voltage level above the HRP might be interpreted as "0", and below the HRP as "1".Hard reads (1H) are quick and require less computational power than soft reads (1H2S) or (1H1S).

Soft reads (1H1S, 1H2S, 1H3S etc) are a combination of a hard bit and soft bits and can be used by the memory device to provide the binary soft information. The "soft bits" provide additional information about the probability or confidence level of the bit being a "0" or "1". Soft bits are generated through multiple reads at different voltage levels, referred to as soft bit read (SBR) thresholds, around the Hard Read Position, HRP, the voltage used to determine the hard bit. These additional reads with respect to the SBR thresholds help ascertain the likelihood of a state of a cell, providing a gradient of certainty rather than a binary yes/no answer. For example, if a memory cell's voltage is very close to the threshold between a "0" and a "1", the soft bits might indicate lower confidence (low reliability) in the hard bit's value, marking it as weak. Conversely, if the voltage is far from the threshold, the soft bits would indicate higher confidence (high reliability), marking it strong.

Thus, the bit soft information used by the hard information decoder can include both hard and soft bits. The soft information used by the hard information decoder can come from NAND reads of 1H1S, 1H2S etc., or soft information generated by the soft information decoder using hard read from NAND. According to the example herein, the soft information that may be used by the hard information decoder can be generated by the soft information decoder using hard input from a NAND memory device. The hard bits represent an immediate "0" or "1" determination (and thus represent the originally read codeword), while the soft bits provide reliability or confidence levels based on additional voltage readings for those bits. Stated differently, the bit soft information used by the hard information decoder can include hard bits and soft bits, whereas a hard bit of the hard bits indicates whether a bit is a "0" or a "1" of the originally read codeword and a soft bit of the soft bits indicates reliability or confidence in a hard bit value for that hard bit. The hard information decoder does not generate soft information internally and hence the name "hard information decoder" even though at its input the hard information decoder can use both hard and soft information.

Some hard information decoder implementations allow for the integration of bit soft information without adding new hardware resources, which helps keep power and area requirements within design constraints. Other hard information decoder implementations integrate bit soft information through addition of new hardware resources, however, this comes at a cost, as additional power and area are needed to accommodate the new resources. Hard information decoders require less power to operate and an area when compared to soft information decoders. Hard information decoders can decode codewords encoded with LDPC codes or other error-correcting codes while consuming less energy per bit than soft information decoders. However, this efficiency comes at a cost of reduced error correction capabilities, when compared to more robust decoders, such as soft information decoders.

Soft information decoders incorporate more internal hardware resources (e.g., gates) and are capable of executing advanced decoding algorithms, such as a Min-Sum Algorithm (MSA), and thus have greater error correction capabilities when compared to hard information decoders. Soft information decoders offer improved error correction by handling a greater number of errors or more complex error patterns. This makes soft information decoders more reliable (than hard information decoders) in scenarios where data accuracy is important, as soft information decoders can recover an originally read codeword even under significant error conditions. However, soft information decoders' enhanced reliability comes with increased computational demands, resulting in higher energy consumption and longer processing times when compared to hard information decoders. Thus, while soft information decoders are more effective at ensuring data integrity, soft information decoders are less suitable for performance-important applications like mobile and enterprise environments, where efficiency, speed and low energy consumption are prioritized.

For example, mobile devices have limited battery power, making continuous use of energy-intensive soft information decoders impractical because such decoders have high energy consumption requirements. Similarly, in enterprise environments, where resource optimization is desired for scalability and cost-effectiveness, the significant resource demands of soft information decoders can lead to inefficiencies. To address these concerns, mobile devices and enterprise systems often employ hard information decoders as a primary error correction method and a soft information decoder as a secondary error correction method. In situations where the hard information decoder fails to decode a codeword, the soft information decoder is activated. This failure usually occurs when errors are too complex or numerous for the hard information decoder to handle effectively. When the hard information decoder fails to decode, the soft information decoder, which uses a more powerful and resource-intensive algorithm, re-processes the codeword.

For example, to decode a codeword, the codeword is read and received by the hard information decoder as an originally read codeword. The hard information decoder can be implemented as part of the memory sub-system controller and uses a decoding algorithm (corresponding to a decoding process) to correct any errors in the originally read codeword. The codeword can be generated by encoding data using the LDPC code, which is defined by a PC matrix $\overline{H}$. The originally read codeword should ideally satisfy the equation Hc=0, which indicates that the originally read codeword lies in a null space of the PC matrix, meaning that the originally read codeword is error-free. The originally read codeword can contain errors when received; this leads to the PC matrix not being satisfied $H_c \neq 0$, which indicates that the originally read codeword does not lie in the null space of the PC matrix and thus needs correction.

Each row of the PC matrix corresponds to a PC equation (also known as a check node). To check the originally read codeword for errors, the hard information decoder uses the PC matrix to compute a syndrome vector, where each entry in the syndrome vector corresponds to a result of the PC equation for the originally read codeword. The syndrome vector includes entries (e.g., 1's and 0's) indicative of whether the PC equations have been satisfied (e.g., equal to 0). For example, if an i-th entry in the syndrome vector is 0, this means that an i-th check node has been satisfied; if it is not 0, then the i-th check node is unsatisfied, which indicates that one or more bits in the originally read codeword need correction (have errors). The i-th check node refers to a specific PC equation associated with the i-th row of the PC matrix. In some examples, the hard information decoder determines that the PC equations have not been satisfied (e.g., not all entries in the syndrome vector are 0) and flips one or more bits of the originally read codeword iteratively until the PC equations are satisfied (e.g., until Hc=0 is achieved).

For example, in some instances, during the decoding process, the hard information decoder uses the match criteria and the soft information to identify a set of bit-flipping thresholds for each decoding iteration that are to be used in determining whether one or more bits of the current state of the codeword should be flipped. As an example, if a current value of a bit in the current state of the codeword matches a value of a corresponding bit in the originally read codeword (corresponding to a match state) and the bit in the current state of the codeword is classified as "weak," the hard information decoder can apply a first bit-flipping threshold of the set of bit-flipping thresholds. If the bit is in a match state and is classified as "strong," the hard information decoder can apply a second bit-flipping threshold of the set of bit-flipping thresholds. If the bit does not match the originally read bit (corresponding to a mismatch state) and is classified as "weak," the hard information decoder can apply a third bit-flipping threshold of the set of bit-flipping thresholds. If the bit is in a mismatch state and classified as "strong," the hard information decoder can apply a fourth bit-flipping threshold of the set of bit-flipping thresholds.

During one or more decoding iterations, the hard information decoder calculates a number of unsatisfied check nodes (PC violations) associated with each bit in the current state of the codeword. The hard information decoder then compares the number of PC violations for each bit to a bit-flipping threshold (e.g., one of the first, second, third, or fourth bit-flipping thresholds) to determine whether that bit in the current state of the codeword should be flipped. If the number of PC violations for a bit exceeds its bit-flipping threshold, whether it is for a matched/strong, matched/weak, mismatch/strong, or mismatch/weak condition, the hard information decoder flips that bit in the current state of the codeword. This iterative decoding process continues at the hard information decoder until all errors in the originally read codeword have been corrected using the matching criteria and the soft information or a maximum number of iterations have been reached.

In some implementations, one or more bit-flipping thresholds used by the hard information decoder at each decoding iteration can be optimized offline using a machine learning (ML) iterative algorithm. This optimization process determines optimal bit-flipping thresholds by simulating decoding scenarios that consider the match criteria and the soft information. The optimized bit-flipping thresholds can be selected based on a cost metric such as CWER or an average iteration count (avgIter). CWER measures the proportion of codewords that remain erroneous after decoding, while avgIter tracks the number of iterations required to successfully decode a codeword. Once determined, the optimized bit-flipping thresholds can be applied by the hard information decoder during the decoding process.

The hard information decoder tracks during the decoding process whether a bit value for each bit in the current state of the codeword matches the bit value of a corresponding bit in the originally read codeword. For example, the hard information decoder uses a match status vector (or data structure (e.g., a table)) to track matches and mismatches of bit values between the originally read codeword and the current state of the codeword. Each entry in the match status vector can indicate a match or mismatch state for bits of the current state of the codeword. The match status vector is updated during or after each decoding iteration to reflect if the bits of the current state of the codeword for that decoding iteration match the corresponding bits in the originally read codeword Thus, as the decoding process progresses over multiple decoding iterations and one or more bits are flipped during one or more decoding iterations, the match/mismatch state values in the match status vector are updated accordingly.

For example, if a bit in the current state of the codeword matches the corresponding bit in the originally read codeword, the hard information decoder updates the match status vector with a bit value to indicate "matched" (e.g., "0"). If the bit in the current state of the codeword does not match the corresponding bit in the originally read codeword, the hard information decoder updates the match status vector with a bit value to indicate "mismatch" (e.g., "1"). In some examples, the hard information decoder uses the match status vector in combination with the soft information to determine whether a respective bit of the current state of the codeword should or should not be flipped.

While the bit-flipping algorithm of hard information decoders is effective, such algorithms struggle in complex error scenarios due to their inherent limitations. These challenges arise from simplified bit-flipping thresholds that may not accurately account for nuanced error patterns, leading to missed or incorrect bit-flips.

According to one or more examples herein, a decoding algorithm is disclosed for decoding a codeword that addresses challenges in correcting errors, such as in complex error scenarios where existing techniques can fail. For example, a controller of a memory sub-system can read a codeword from a memory device, referred to as an originally read codeword, and use a soft information decoder to perform several decoding iterations during a first decoding process. The soft information decoder can generate an error vector that identifies which bits of the codeword have been flipped in response to the first decoding process. For example, reliability measures, such as LLR values, calculated for a current state of the codeword after a predefined number of decoding iterations (e.g., at a last decoding iteration) of the first decoding process can be used for generating the error vector and bit reliability information. The current state of the codeword after the predefined number of decoding iterations can be referred to as an output codeword.

The controller can also generate bit reliability information based on reliability measures to indicate the strength of the bits in the output codeword. A bit that has low reliability can be considered as a weak bit because it is less certain that the bit is correct. A bit that has a high reliability can be considered as a strong bit because it is more certain that the bit is correct. The bit reliability information of the output codeword reflects a decoder's confidence in the correctness of the bits relative to the originally read codeword. As such, the bit reliability information classifies the bits of the output codeword as either strong (indicating a high confidence or probability that the bit is correct) or weak (indicating a low confidence or probability that the bit is correct) based on the reliability measures. A reliability measure greater than a certain threshold can be referred to as high, indicating high confidence in a bit's correctness, while a measure below the threshold indicates low confidence and is referred to as low. This information can be used jointly with the match status vector.

The controller can use a reliability enabled hard information decoder to decode the codeword during a second decoding process based on the error vector and the reliability information. During a first decoding iteration of the second decoding process, the reliability enabled hard information decoder utilizes initial bit-flipping thresholds to determine which bits should be flipped based on the error vector and the bit reliability information. The initial bit-flipping thresholds can include four initial bit-flipping thresholds based on match/mismatch states and a strength (reliability) classification of the bits. The first initial bit-flipping threshold can be applied when a bit in a current state of the codeword is determined to be in a match state and is identified as weak. The second initial bit-flipping threshold can be used when the bit in the current state of the codeword is in a match state and is identified as strong. The third initial bit-flipping threshold can be applied when the bit in the current state of the codeword is determined to be in a mismatch state and is classified as weak. The fourth initial bit-flipping threshold is used when the bit in the current state of the codeword is in a mismatch state and is classified as strong.

For example, during the first decoding iteration, the current state of the codeword is the originally read codeword as no decoding iterations have been performed by the reliability enabled hard information decoder. The reliability enabled hard information decoder can calculate a number of PC violations for each bit of the current state of the codeword. The reliability enabled hard information decoder can compare the PC violations for each bit to identify or select a respective initial bit-flipping threshold of the initial bit-flipping thresholds for each bit. For instance, if a bit in the originally read codeword has been flagged by the error vector from the soft information decoder as being in a mismatch state and is classified (identified) as weak by the reliability information, the reliability enabled hard information decoder compares the number of PC violations for that bit against the third initial bit-flipping threshold to determine whether it should be flipped. For example, if the number of PC violations exceeds this bit-flipping threshold, the reliability enabled hard information decoder will flip that bit during the first decoding iteration.

During subsequent decoding iterations of the second decoding process, the reliability enabled hard information decoder utilizes adaptive bit-flipping thresholds that are selected or identified based on a match status vector and the bit reliability information obtained from the first decoder. The match status vector indicates a match or mismatch state of each bit in the current state of the codeword relative to the originally read codeword. As the decoding process continues, the reliability enabled hard information decoder uses the bit reliability information and the match/mismatch states from the match status vector to choose adaptive bit-flipping thresholds for each decoding iteration. These thresholds can be selected from a predefined set of adaptive bit-flipping thresholds. The decoder evaluates each bit in the current state of the codeword against these thresholds, using the bit's PC violations to decide whether or not to flip the bit.

The reliability enabled hard information decoder continues the second decoding process until all errors are corrected, or a maximum number of iterations is reached, using the adaptive bit-flipping thresholds. If the originally read codeword is successfully decoded during the second decoding process, user data (or the requested data) from the decoded originally read codeword is provided to a host system. If the decoding is unsuccessful, the controller re-engages the soft information decoder to perform additional iterations during a third decoding process. Should this extended decoding still fail, the controller may request the memory device to retransmit the codeword, allowing a process to start over, such as disclosed herein.

FIG. 1 illustrates an example computing system 100 that includes a memory sub-system 110 in accordance with some examples of the present disclosure. The memory subsystem 110 can include media, such as one or more volatile memory devices (e.g., memory device 140), one or more non-volatile memory devices (e.g., memory device 130), or a combination of such. The memory sub-system 110 can be a storage device, a memory module or a hybrid of a storage device and a memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card and a hard disk drive (HDD). Examples of memory modules include a dual in-line memory module (DIMM), a small outline DIMM (SO-DIMM) and various types of non-volatile dual in-line memory modules (NVDIMMs).

The system 100 can be a computing device such as a desktop computer, laptop computer, network server, mobile device, a vehicle (e.g., airplane, drone, train, automobile or other conveyance), Internet of Things (IoT) enabled device, embedded computer (e.g., one included in a vehicle, industrial equipment or a networked commercial device) or such computing device that includes memory and a processing device. The system 100 can include a host system 120 that is coupled to one or more memory sub-systems 110. In some examples, the host system 120 is coupled to different types of the memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller) and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface, or any other interface.

The physical host interface can be used to transmit data between the host system 120 and the memory sub-system 110. The host system 120 can further utilize an NVM Express (NVMe) interface to access the memory components (e.g., memory device(s) 130) when the memory sub-system 110 is coupled with the host system 120 by the physical host interface (e.g., a PCIe or CXL bus). The physical host interface can provide an interface for passing control, address, data and other signals between the memory sub-system 110 and the host system 120. FIG. 1 illustrates a memory sub-system 110 as an example. In general, the host system 120 can access multiple memory sub-systems via a same communication connection, multiple separate communication connections and/or a combination of communication connections.

The memory device 130 and the memory device 140 are implemented as non-transitory computer readable media. The memory device 130 and the memory device 140 can include any combination of the different types of non-volatile memory devices and/or volatile memory devices. The volatile memory devices (e.g., the memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include NAND type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

In some examples, a non-volatile memory device is a package of one or more dies. The dies in the packages can be assigned to one or more channels for communicating with the controller 115. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Each of the memory device(s) 130 include one or more arrays of memory cells. One type of memory cell, for example, single level cells (SLC) can store one bit per cell. Other types of memory cells, such as multi-level cells (MLCs), triple level cells (TLCs), quad-level cells (QLCs) and penta-level cells (PLC's) or higher, can store multiple bits per cell. In some examples, each of the memory devices 130 can include one or more arrays of memory cells such as SLCs, MLCs, TLCs, QLCs, PLC's or some combination thereof. In some examples, a particular memory device can include an SLC portion, an MLC portion, a TLC portion, a QLC portion, and/or a PLC portion of memory cells. Depending on a cell type, a cell can store one or more bits of binary information and has various logic states that correlate to a number of bits being stored. The logic states can be represented by binary values, such as "0" and "1", or combinations of such values. The memory cells of the memory devices 130 can be grouped as pages that can refer to a logical unit of the memory device used to store data. In some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-OR (NOR) flash memory, electrically erasable programmable read-only memory (EEPROM), etc.

A memory sub-system controller 115 (or controller 115 for simplicity) communicates with the memory device(s) 130 to perform operations such as reading data, writing data or erasing data at the memory devices 130 and other such operations. The memory sub-system controller 115 can include hardware such as one or more integrated circuits and/or discrete components, a buffer memory or some combination thereof. The hardware can include a digital circuitry with dedicated (e.g., hard-coded) logic to perform the operations described herein. The memory sub-system controller 115 can be a microcontroller, special purpose logic circuitry (e.g., a field programmable gate array (FPGA), an application specific integrated circuit (ASIC), etc.) or other suitable processor.

The memory sub-system controller 115 can include a processing device, which includes one or more processors (e.g., the processor 117), configured to execute instructions stored in a local memory 119. In the illustrated example, the local memory 119 of the memory sub-system controller 115 includes an embedded memory configured to store instructions for performing various processes, operations, logic flows and routines that control operation of the memory sub-system 110, including handling communications between the memory sub-system 110 and the host system 120. The local memory 119 is a non-transitory computer-readable medium.

In some examples, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another example, a memory sub-system 110 does not include a memory sub-system controller 115 and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and ECC operations, encryption operations, caching operations and address translations between a logical address (e.g., a logical block address (LBA), namespace) and a physical address (e.g., physical block address) that are associated with the memory devices 130. The memory sub-system controller 115, for example, may employ a Flash Translation Layer (FTL) to translate logical addresses to corresponding physical memory addresses, which can be stored in one or more FTL mapping tables. In some instances, the FTL mapping table can be referred to as a logical-to-physical (L2P) mapping table storing L2P mapping information. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. For example, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some examples, the memory devices 130 include local media controllers 135 that operate in concert with the memory sub-system controller 115 to execute operations on one or more memory cells of the memory devices 130. An external controller (e.g., the memory sub-system controller 115) can externally manage the memory device 130 (e.g., perform media management operations on the memory device 130). In some examples, the memory sub-system 110 is a managed memory device, which is a raw memory device 130 having control logic (e.g., local media controller 135) on the die and a controller (e.g., the memory sub-system controller 115) for media management within the same memory device package. An example of a managed memory device is a managed NAND (MNAND) device.

The memory device 130 and the memory device 140 are structured to include wordlines. Wordlines are addressable wiring lines that connect and control a row of memory cells in the memory device 130 and the memory device 140. Each wordline addresses the cells in a corresponding row contemporaneously, enabling operations such as reading, writing and erasing data. The memory device 130 and the memory device 140 can be organized into an array of cells arranged in blocks, with each block containing multiple pages. The cells in a page are connected by these wordlines horizontally and bitlines vertically, forming a grid-like structure that allows for efficient data access and management.

In some examples, the memory sub-system 110 includes an error corrector 113 that executes an error-handling of data read from the memory device 130 and/or the memory device 140. In operation, the host system 120 manages and controls the flow of data between itself and the memory sub-system 110, ensuring efficient data storage and retrieval operations. More generally, the host system 120 employs the memory sub-system 110 to write data to and read data from the memory sub-system 110. For instance, the host system 120 processes these requests for reading and/or writing data by interacting with the memory sub-system 110, managing the flow of data to and from the memory device 130 and/or the memory device 140 within the memory sub-system 110. This reading and writing of data enables operation of computing systems where data access and management is needed.

For example, in some instances, the controller 115 can retrieve or receive a codeword from the memory device 130 or the memory device 140. The controller 115 may retrieve a codeword (referred to as an originally read codeword) in response to a read command from the host system 120. This read command typically corresponds to a request for specific data stored within the memory sub-system 110. By way of example, the controller 115 can retrieve the originally read codeword from a NAND memory device, which can be represented by the memory device 130 or the memory device 140. The controller 115 can perform a read operation, such as a NAND read operation. During this process, the controller 115 accesses a block of memory cells in the memory device 130 or memory device 140, where the requested data (stored as a codeword) resides. The data is stored in the form of a codeword, which includes both the original data and additional parity bits used for error correction. These parity bits are generated during an encoding process of the original data, using an ECC such as LDPC codes and are stored alongside the original data in the memory device 130 or the memory device 140. Parity bits are additional bits added to the original data to help detect and correct errors.

Figure 2:
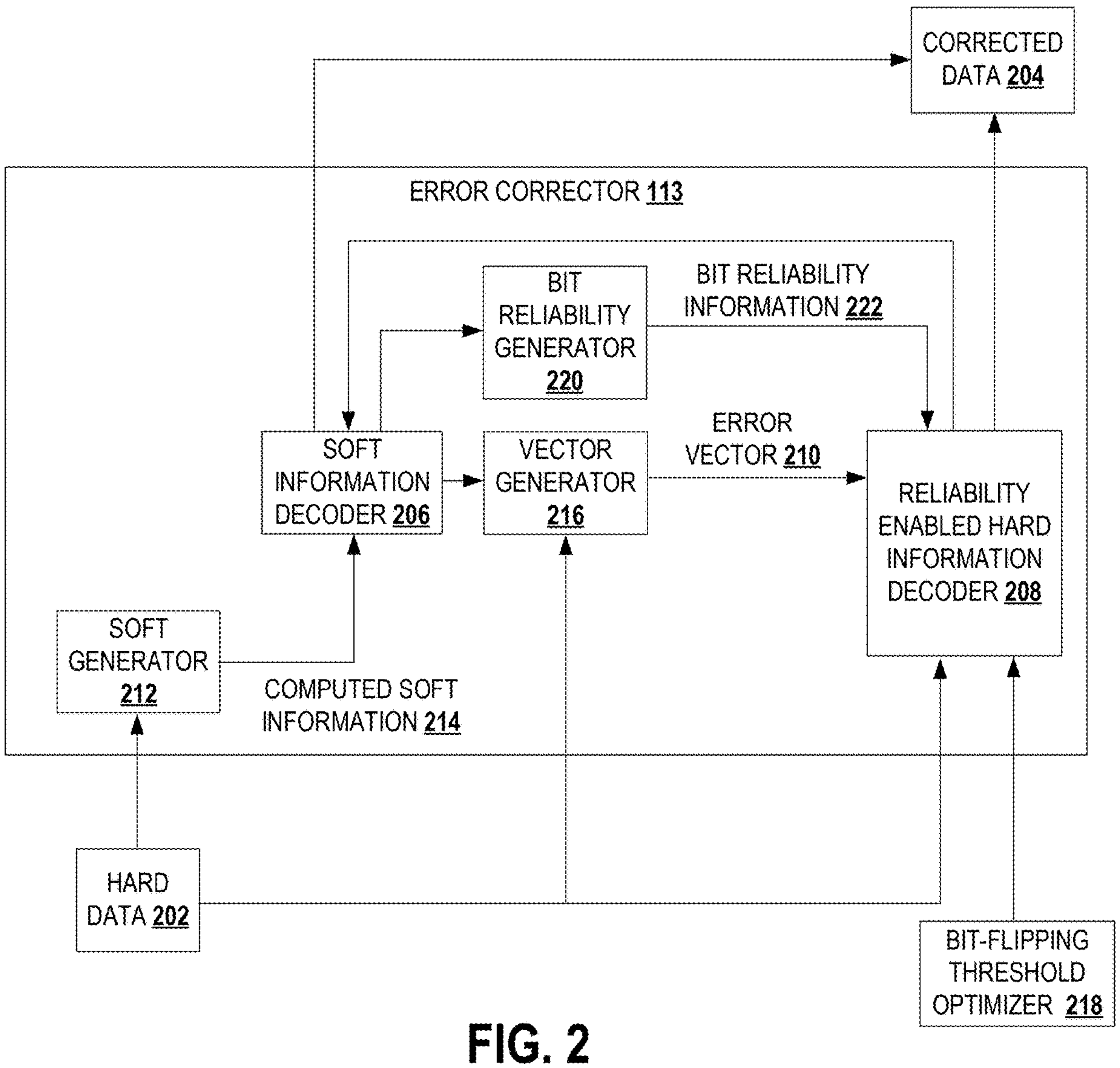
FIG. 2 illustrates an error corrector of a memory sub-system of the computing system of FIG. 1.

In some instances, the controller 115 can implement an encoding algorithm (e.g., an ECC algorithm) to generate a codeword. The generated codeword can be stored in the memory device 130 or the memory device 140 for later retrieval as the originally read codeword. The controller 115 retrieves or receives a codeword from a memory array corresponding to reading the data in response to a read operation. The read data can be referred to as hard data 202, as shown in FIG. 2. FIG. 2 illustrates an example of the error corrector 113 of FIG. 1. The error corrector 113 can be implemented using one or more modules, shown in block form in the drawings. The one or more modules can be in software or hardware form, or a combination thereof. In some examples, one or more functions of the error corrector 113 can be implemented as machine readable instructions for execution by the controller 115, as shown in FIG. 1.

For example, the memory device 130 or the memory device 140 can perform read operations, such as hard reads (1H) to provide the hard data 202. Hard data 202 represents a set of hard bits that are the original uncorrected bits read from memory. The "hard bit" in this context is a binary read of data where each bit is read and immediately interpreted as either a '0' or a '1', based on a fixed threshold (e.g., a Hard Read Position, HRP). For example, in NAND flash memory, a voltage level above the HRP might be interpreted as "0", and below the HRP as "1". Hard reads (1H) are quick and require less computational power than soft reads. Thus, a hard read performed by the memory device 130 or the memory device 140 can be used to provide the hard data 202.

After retrieving or receiving the hard data 202, the controller 115 can use the error corrector 113 to process the hard data 202 (the originally read codeword) and correct any errors to provide corrected data 204 corresponding to a corrected codeword. For example, if the data stored in the memory cells is subject to noise or degradation, one or more bits of the originally read codeword may be incorrect. The error corrector 113 applies a decoding algorithm to the hard data 202 to correct any errors and reconstruct the original data (in some instances known as user data). The controller 115 can un-append or extract the original data from the corrected data 204 as requested data and provide the requested data to the host system 120.

For example, to decode the originally read codeword, the computed soft information 214 (provided based on the hard data 202) is processed by the soft information decoder 206 during a first decoding process for a predefined number of decoding iterations. Then the hard data 202 is processed by the reliability enabled hard information decoder 208 during a second decoding process using information (e.g., an error vector 210 and bit reliability information 222) from the first decoding process to decode the originally read codeword. During the first decoding process, the soft information decoder 206 performs a limited number of predefined (or hardwired) decoding iterations, followed by the reliability enabled hard information decoder 208, which operates faster, to reprocess the originally read codeword based on the error vector 210 and the bit reliability information 222 to provide the corrected data 204. The number of decoding iterations performed during the first decoding process by the soft information decoder 206 can be determined based on simulations. In some examples, from about 1 to about 5 decoding iterations are performed by the soft information decoder 206 during the first decoding process.

The soft information decoder 206 is a more resource-intensive decoder compared to the reliability enabled hard information decoder 208. This is due to the soft information decoder 206 utilizing more internal decoder hardware resources and implementing more advanced decoding algorithms, such as an iterative message-passing algorithm. Example iterative message-passing algorithms can include a Min-Sum Algorithm (MSA). In some examples, the soft information decoder 206 uses an algorithm that can aid the hard information decoder 208. The soft information decoder 206 is configured to use computed soft information 214 for correcting errors in the originally read codeword. The computed soft information 214 can include information about a likelihood or confidence of a bit being correct. The computed soft information 214 can include reliability values, such as LLR values, which provide a measure of confidence for each bit in the originally read codeword. For example, an LLR value indicates a probability that a particular bit is either “0” or “1”, where a higher magnitude of LLR reflects a higher confidence level.

Because the soft information decoder 206 operates based on computed soft information 214 (e.g., LLR values), the error corrector 113 can include a soft information generator 212 to provide the computed soft information 214 based on the hard data 202. In some examples, the soft information generator 212 provides the computed soft information 214 using a bit-to-LLR mapping data structure (or table), which assigns an LLR value to each bit of the hard data 202 based on its binary state. The computed soft information 214 can be stored in the local memory 119.

For example, the bit-to-LLR mapping data structure can assign a positive LLR value (e.g., +7) for a bit of “0” and a negative LLR value (e.g., −7) for a bit of “1”. In some examples, before the soft information decoder 206 is employed for error decoding, the LLR values that are to be used for the bits “0” and “1” in the originally read codeword are optimized according to an optimization process. This optimization process can be conducted offline, prior to the actual use of the soft information decoder 206. The optimization process can include simulating a decoding process of the soft information decoder 206 across a range of LLR values and evaluating an error correction performance from the simulation to identify the LLR values that minimize a CWER and reduce a number of iterations needed for decoding.

In some examples, the soft information decoder 206 can use the iterative message-passing algorithm to correct errors in the codeword based on the computed soft information 214. The soft information decoder 206 receives the computed soft information 214, which includes reliability values, such as LLR values for the bits of the originally read codeword and uses these LLR values to initialize internal structures, such as messages. At an outset of the first decoding process, the soft information decoder 206 assigns LLR values from the computed soft information 214 as initial LLR values for one or more messages. Each message represents a variable node’s initial belief about a correct value of a bit, reflecting a confidence level indicated by an LLR value. For instance, if the computed soft information 214 suggests that a bit is likely “1”, the initial message from a corresponding variable node will indicate a strong likelihood of that bit being “1”.

During the first decoding process, the iterative message-passing algorithm operates by passing messages between variable nodes and check nodes over the predefined number of decoding iterations. The variable nodes correspond to the bits of the originally received codeword, while the check nodes correspond to the PC equations defined by a PC matrix. Before iterative decoding, the codeword is associated with a PC matrix by the soft information decoder 206. The PC matrix represents the set of PC equations, with each row corresponding to a specific equation and each bit in the codeword participating in one or more of these PC equations.

During one or more decoding iterations, the soft information decoder 206 updates the messages based on constraints imposed by the PC equations. For example, during one or more decoding iterations of the predefined number of decoding iterations, the soft information decoder 206 evaluates the current state of the codeword by comparing updated bit estimates, which are derived from the LLR values, against the PC equations, to determine how well these estimates satisfy the PC equations. The soft information decoder 206 uses the PC matrix to validate a consistency of bit estimates derived from the LLR values. The PC matrix is applied to these bit estimates to generate a syndrome vector, which indicates whether the PC equations are satisfied or not.

The syndrome vector identifies where inconsistencies, and thus likely errors exist in the bit estimates to influence the soft information decoder 206 in making iterative corrections. In each decoding iteration during the first decoding process, the soft information decoder 206 utilizes information from the syndrome vector to update its estimates of the bit states. In response to the syndrome vector, the soft information decoder 206 analyzes unsatisfied PC equations and adjusts the messages associated with the corresponding bits, increasing a likelihood that these bits will be corrected in subsequent decoding iterations. By continually updating the messages based on feedback from the syndrome vector and LLR values, the soft information decoder 206 progressively improves its estimation of correct bit values (represented by a current state of the codeword for a given decoding iteration), thereby reducing the number of errors in the codeword iteratively.

This first decoding process continues until the soft information decoder 206 has completed the predefined number decoding iterations corresponding to a stop condition. In response to the stop condition, the soft information decoder 206 (or the controller 115) uses reliability values (LLR values) from a final decoding iteration of the predefined number of decoding iterations to determine the current state of the codeword corresponding to an output codeword. The soft information decoder 206 (or a vector generator 216, as shown in FIG. 2) then converts these LLR values, which represent a confidence level for each bit after a last (or final decoding iteration) of the predefined number of decoding iterations or during the last decoding iteration, back into binary values (“0” or “1”) to provide the output codeword. The LLR values are associated with an updated state (or current stage) of the codeword after the soft information decoder 206 has performed a limited number of iterations or at the final decoding iteration. Thus, the LLR values can be remapped into corresponding binary values to provide the output codeword. For example, if an LLR value is greater than 0, the bit is “0” and if the LLR value is less than 0 the bit is “1”.

In some examples, the soft information decoder 206 or the vector generator 216 use an LLR-to-bit data structure (or table). The LLR-to-bit data structure includes a range of LLR values that represent the confidence level of each bit being either “0” or “1”. The LLR values can range from highly positive to highly negative, with positive values indicating a higher likelihood of the bit being “0” and negative values indicating a higher likelihood of the bit being “1”. In addition to the bit value, the LLR-to-bit data structure also outputs a corresponding confidence level, which is used in the reliability enabled hard information decoder 208. Thus, the LLR-to-bit data structure can function, in some instances, as a lookup mechanism where the LLR values from the final iteration (corresponding to a current state of the codeword) are checked against this data structure.

In some examples, the LLR-to-bit data structure includes LLR values that are categorized into reliability indicators based on confidence thresholds. Each LLR value can be mapped to one of four states: “1 weak,” “1 strong,” “0 weak,” and “0 strong.” This mapping classifies each bit in the codeword retrieved from the memory device 130 as either “strong” or “weak” based on a magnitude of its LLR value and a corresponding binary value (“0” or “1”). The LLR-to-bit data structure can be optimized offline. Thus, each bit in the current state of the codeword can be classified by a respective binary state and by a corresponding strength or confidence level. The originally read codeword from the memory device 130, along with the mapped LLR values can be used as input to the reliability-enabled hard information decoder 208, allowing the decoder to make more informed bit-flipping decisions.

Once LLR-to-bit conversion is complete, the current state of the codeword (the output codeword), represented as binary values, is obtained and can be provided to the vector generator 216 for generating the error vector 210.

In some examples, the vector generator 216 generates the error vector 210 by comparing the current state of the codeword (the output codeword) with the originally read codeword (the hard data 202). For example, the vector generator 216 can implement a comparison by XORing the output codeword with the originally read codeword to provide the error vector 210, which can be stored in the local memory 119. The error vector 210 indicates which bits have been flipped in the originally read codeword by the soft information decoder 206 during the first decoding process. For example, a "1" in the error vector 210 indicates that a corresponding bit in the originally read codeword was flipped, while a "0" indicates that the bit remained unchanged. The error vector 210 is a binary vector where each position corresponds to a bit in the originally read codeword. Thus, the error vector 210 can indicate which bits in the originally read codeword have been flipped by the soft information decoder 206 during the first decoding process.

The error vector 210 can be fed into the reliability enabled hard information decoder 208 as an input, as shown in FIG. 2. Because the error vector 210 indicates which bits have been flipped, the error vector 210 can represent match/mismatch states for bits of the output codeword. The reliability enabled hard information decoder 208 uses this match/mismatch state information from the error vector 210 and the bit reliability information 222 to inform its bit-flipping decisions during its own decoding process, referred to herein as a second decoding process, so that the reliability enabled hard information decoder 208 can attempt to decode the originally read codeword.

In some examples, in response to the stop condition for the first decoding process, the soft information decoder 206 uses reliability values, such as LLR values from the final decoding iteration of the predefined number of decoding iterations to provide the reliability information 222. The reliability information 222 can indicate the strength of the bits in the output codeword. A bit that has low reliability can be considered as a weak bit because it is less certain that the bit is correct. A bit that has a high reliability can be considered as a strong bit because it is more certain that the bit is correct. The bit reliability information of the output codeword reflects a decoder's confidence in the correctness of the bits relative to the originally read codeword.

For example, the LLR values from the final decoding iteration, which reflect a confidence level of each bit in the output codeword being correct, can be provided to a bit reliability generator 220 of the error corrector 113. The bit reliability generator 220 processes these LLR values by applying a strength (reliability) threshold to determine whether each bit in the output codeword should be classified as strong or weak. For instance, if the absolute value of an LLR for a bit in the output codeword is less than the strength threshold, the bit is recorded (or marked) as weak by the bit reliability generator 220. Conversely, if the absolute value of the LLR for a bit is greater than or equal to the strength threshold, the bit is recorded (or marked) as strong. This classification process of the bit reliability generator 220 transforms the LLR values for the output codeword into binary strength (reliability) indicators, where a "strong" bit (e.g., "1") suggests high confidence in its correctness, and a "weak"bit (e.g., "0") suggests lower confidence. The bit reliability information 222 is soft information because it encapsulates a strength or weakness of each bit in the output codeword. The bit reliability information 222 can be provided as an input to the reliability enabled hard information decoder 208, as illustrated in FIG. 2. The bit reliability information 222 can be used by the reliability enabled hard information decoder 208 as bit soft information, and thus influence a bit decision flipping process of the reliability enabled hard information decoder 208.

For example, the error corrector 113 utilizes the reliability enabled hard information decoder 208 to process the hard data 202 (the originally read codeword) using the error vector 210 and the bit reliability information 222 during a first decoding iteration of a second decoding process. In existing approaches, hard information decoders are typically initialized with zero values in a match status vector or zero matched/mismatch state values, indicating that the originally read codeword matches a current state of the codeword, as no error correction process or bit-flipping iterations have been performed yet. As a decoding process progresses, the matched/mismatch status values (or the match status vector) can be updated to reflect the match or mismatch states of each bit in the current state of the codeword relative to the originally read codeword after or for each decoding iteration. These match/mismatch state values can be used by the reliability enabled hard information decoder 208 to determine whether a bit should be flipped based on predefined bit-flipping thresholds.

In some existing hard information decoder approaches can encounter difficulties in more complex error decoding scenarios and thus fail to effectively differentiate bits based on a number of PC violations and match/mismatch statuses. This failure can be due to inherent limitations of a bit-flipping algorithm and bit flipping criteria used by the hard information decoder for error correction. Starting an error correction process at the reliability enabled hard information decoder 208 based on the error vector 210 or using the error vector 210 as the match status vector and the bit reliability information 222 as the bit soft information enables the reliability enabled hard information decoder 208 to correct bit errors more effectively than if it relied solely on initial match values (e.g., "0") or an initial match status vector of the match status vector. This approach overcomes the challenges of existing hard information decoders, and allows the reliability enabled hard information decoder 208 to target likely error locations identified by the soft information decoder 206, improving error correction capabilities and achieving a lower CWER at a given RBER without needing additional hardware resources.

In some examples, to decode the originally read codeword (the hard data 202), the reliability enabled hard information decoder 208, during the second decoding process for its first decoding iteration, uses the error vector 210. In some examples, the reliability enabled hard information decoder 208 stores the error vector 210 in a data structure corresponding to the match status vector in the local memory 119. Thus, in some instances, the error vector 210 can represent an initial state of the match status vector. The reliability enabled hard information decoder 208 during the first decoding iteration determines a number of initial PC violations for each bit in the originally read codeword (the hard data 202).

The reliability enabled hard information decoder 208 can decode the originally read codeword, using the error vector and the bit reliability information 222 as a starting point (e.g., at the first decoding iteration).

For example, during the first decoding iteration, the reliability enabled hard information decoder 208 can use a set of initial bit-flipping thresholds that includes initial bit-flipping thresholds for different combinations of match/mismatch status values of the error vector 210 and bit strength values of the bit reliability information 222 that could occur during the first decoding iteration. The initial set of bit-flipping thresholds can include a first initial bit-flipping threshold, a second initial bit-flipping threshold, a third initial bit-flipping threshold and a fourth initial bit-flipping threshold.

The first initial bit-flipping threshold can be applied when a bit in the current state of the codeword is in a match state and is identified as weak. The second initial bit-flipping threshold can be used when a bit in the current state of the codeword is in a match state and is identified as strong. The third initial bit-flipping threshold can be applied when a bit in the current state of the codeword is determined to be in a mismatch state and is identified as weak. The fourth initial bit-flipping threshold can be used when a bit is in a mismatch state and is classified as strong.

For subsequent decoding iterations during the second decoding process, the reliability enabled hard information decoder 208 uses adaptive bit-flipping thresholds in its bit decision process for flipping (or not flipping) bits of the current state of the codeword based on bit values of the match status vector and the bit reliability information 222. Thus, bit-flipping thresholds used during the first decoding iteration by the reliability enabled hard information decoder 208 for each bit of the originally read codeword are identified or selected based on bit values of the error vector 210 (or the initial state of the match status vector) and the bit reliability information 222. The bit-flipping thresholds used by the reliability enabled hard information decoder 208 in subsequent iterations of the second decoding process are based on the bit values of the error vector 210 (or a current or updated state of the match status vector) and the bit reliability information 222.

For example, during the first decoding iteration, the reliability enabled hard information decoder 208 can evaluate the initial set of bit-flipping thresholds and PC violations to determine whether a respective bit of the originally read codeword should be flipped. For example, the reliability enabled hard information decoder 208 can identify one of the first, second, third, and fourth initial bit-flipping thresholds for comparison with a corresponding PC violation based on the error vector 210 and the bit reliability information 222. To determine which initial bit-flipping thresholds to use for bit-flip determination for each bit of the original codeword (the hard data 202), the reliability enabled hard information decoder 208 uses bit values in the error vector 210 and strength (reliability) indicator values from the bit reliability information 222. The reliability enabled hard information decoder 208 uses match or mismatch state values (as reflected by the error vector 210), along with the associated strength indicator values from the bit reliability information 222, to select an appropriate initial bit-flipping threshold for each bit of the originally read codeword during the first decoding iteration. For example, a bit that is identified as having a mismatch state (with an error vector value of "1") and has a weak strength indicator might use a different threshold than a bit having a match state (with an error vector value of "0") and has a strong strength indicator.

In some examples, a bit-flipping threshold optimizer 218 can be used to determine the initial bit-flipping thresholds and adaptive bit-flipping thresholds based on an optimization process. The adaptive bit-flipping thresholds can be optimized using a machine learning iterative algorithm (e.g., a trained machine learning model). This optimization process can be conducted as an offline procedure and can involve running simulations where the performance of different bit-flipping thresholds is evaluated (e.g., for a simulated system, such as the system 100 of FIG. 1) based on specific cost metrics, such as CWER and avgIter.

During the optimization process, the machine learning algorithm iteratively adjusts bit-flipping thresholds, learning from simulated outcomes to identify most effective thresholds for minimizing errors and improving decoding efficiency. The machine learning algorithm can evaluate a range of possible thresholds, testing an impact a bit-flipping threshold has on the decoding process, and gradually converges on an optimal set of bit-flipping thresholds (corresponding to the initial and adaptive bit-flipping thresholds used by the controller 115). Once the adaptive bit-flipping thresholds are identified, the adaptive bit-flipping thresholds can be used during bit-flipping decisions during the subsequent decoding iterations of the second decoding process. Different adaptive bit-flipping thresholds may be applied at decoding iterations of the second decoding process as a decoding process progresses or converges to correcting errors in the originally read codeword.

By way of example, during the second decoding process, such as during subsequent decoding iterations (after the first decoding iteration), the reliability enabled hard information decoder 208 compares each bit in the current state of the codeword to a corresponding bit in the originally read codeword to determine a match or mismatch state of each bit. This comparison results in the match status vector updated, where each bit of the vector represents whether a bit in the current state of the codeword matches (or does not match) the corresponding bit in the originally read codeword. The match status vector and the bit reliability information 226 can be used by the reliability enabled hard information decoder 208 to select a respective adaptive bit-flipping threshold from a set of adaptive bit-flipping thresholds at each subsequent decoding iteration. Thus, each bit's match or mismatch state, as recorded in the match status vector, along with the bit reliability information 226 can determine which adaptive bit-flipping threshold will be used for comparison with PC violations. An iterative application of adaptive bit-flipping thresholds continues until all bits of the current state of the codeword satisfy the PC equations, resulting in the decoding of the codeword (the corrected data 204).

The reliability enabled hard information decoder 208 can perform multiple decoding iterations (or cycles) during the second decoding process, to decode the originally read codeword to provide an error free codeword, the corrected data 204. In some cases, the reliability enabled hard information decoder 208 can undergo more decoding iterations than the soft information decoder 206 such as in examples when the soft information decoder 206 initially attempts error correction to provide the error vector 210 and is then followed by the reliability enabled hard information decoder 208. If the reliability enabled hard information decoder 208 is unable to fully correct the hard data 202 (the originally read codeword) after its designated decoding iterations of the second decoding process, the error corrector 113 can initiate a third decoding process with the soft information decoder 206.

During the third decoding process, the soft information decoder 206 can perform a greater number of decoding iterations, and thus surpass an initial allocation given to the soft information decoder 206 during the first decoding process, to potentially achieve an error-free codeword. If, after these additional decoding iterations, the soft information decoder 206 still cannot correct the hard data 202, the error corrector 113 can trigger a retransmission request (e.g., read operation, such as NAND read operation), prompting the memory device 130 or the memory device 140 to resend the stored codeword. A retransmission request refers to a process where the controller 115 requests the memory device 130 or the memory device 140 to re-read the stored data from the memory cells. The controller 115 can transmit a request for the memory device 130 or the memory device 140 to read stored data from memory cells to provide additional data. Thus, the controller 115 can instruct memory device 130 or the memory device 140 to perform another read operation on the specific memory cells containing the codeword corresponding to the additional data. Once the additional data is received, the controller 115 can decode the additional data according to one or more examples herein to provide the corrected data 204. For example, the controller 115 can convert the received additional data to provide new soft information, which can be decoded using a soft information decoder 206.

Figure 3:
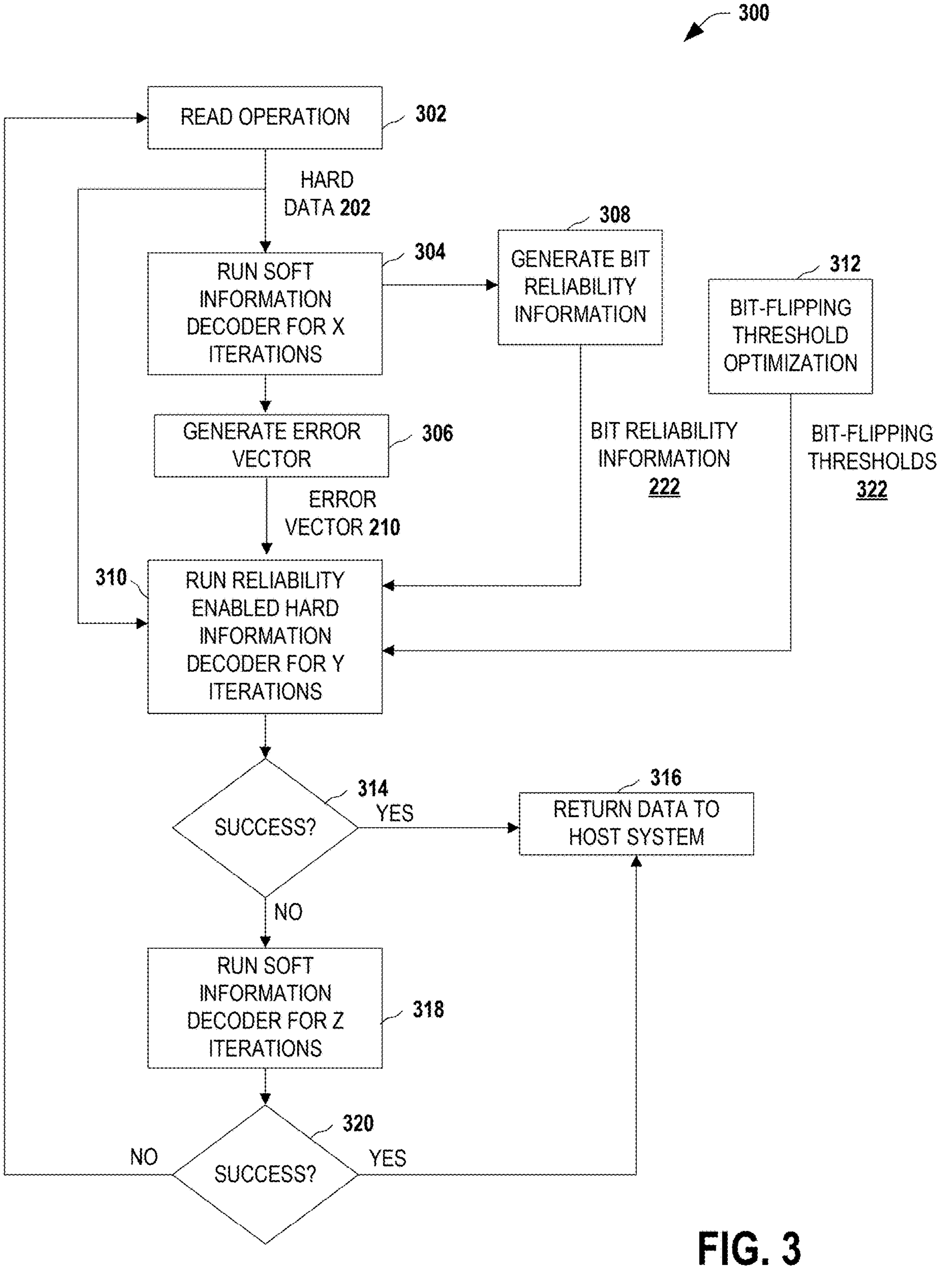
FIG. 3 illustrates a flowchart of an example method for decoding hard data.

FIG. 3 illustrates a flowchart of an example method 300 for decoding hard data 202 (the originally read codeword) according to various embodiments of the present disclosure. The method 300 can be implemented by a controller, such as the memory sub-system controller 115 shown in FIG. 1. This method can be executed by processing logic, which can include hardware (e.g., processing device, circuitry, dedicated logic, programmable logic, microcode, etc.), software (e.g., instructions run or executed on a processing device), or a combination of both. In some examples, the method 300 is performed by the error corrector 113 illustrated in FIGS. 1-2. Although the flowchart illustrates the processes in a particular order, the steps can be rearranged, some steps can be performed in parallel, and others can be omitted entirely.

The method 300 begins at block 302, where the controller 115 performs a read operation (e.g., a NAND read operation) to access a block of memory cells in memory device 130 or memory device 140 to retrieve a codeword (the hard data 202), also can be referred to as the originally read codeword. At block 304, the controller 115 uses the soft information decoder 206 to perform X decoding iterations during an initial (a first) decoding process based on the computed soft information 214 until a first stop condition. The first stop condition can be detected or occur when the soft information decoder 206 performs X decoding iterations. In a non-limiting example, the soft information decoder 206 can perform three decoding iterations. In some examples, the controller 115 provides the computed soft information 214 based on the hard data 202 according to one or more examples herein. The computed soft information 214 can include reliability values, such as LLR values for use by the soft information decoder 206 at block 304 in its decoding process.

At block 306, the controller 115 generates an error vector 210 indicating which bits of the hard data 202 (the originally read codeword) have been flipped by the soft information decoder 206 based on a current state of the codeword for a respective decoding iteration (e.g., a last decoding iteration) of the X decoding iterations. The controller 115 can generate the error vector 210 in response to the first stop condition. The controller 115 can generate the error vector 210 based on an output codeword for a final (last) decoding iteration of the X decoding iterations. The output codeword can be determined based on reliability values for the last decoding iteration of the X decoding iterations. At block 308, the controller 115 can generate the bit reliability information 222, in some examples, in response to the first stop condition. For example, the controller 115 can generate the bit reliability information 222 based on reliability values (e.g., LLR values) for the output codeword at the last decoding iteration of the X decoding iterations.

At block 310, the controller 115 uses the reliability enabled hard information decoder 208 to decode the codeword (the hard data 202) for Y decoding iterations during a second decoding. For example, at block 310, for a first decoding iteration of the Y decoding iterations, the reliability enabled hard information decoder 208 uses the error vector 210 and the bit reliability information 222 to determine which bits of the originally read codeword should be flipped.

In some instances, at block 312, bit-flipping thresholds 322 are determined by a bit-flipping threshold optimizer, such as the bit-flipping threshold optimizer 218 of FIG. 2. The bit-flipping thresholds 322 can include an initial set of bit-flipping thresholds and adaptive sets of bit-flipping thresholds. The controller 115 can use the initial set of bit-flipping thresholds during the first decoding iteration of the second decoding process in its bit-flipping decision process (or determination). For example, the controller 115 can determine a number of PC violations for one or more bits of the current state of the codeword (corresponding to the originally read codeword). The controller 115 can identify corresponding match or mismatch states for each bit of the current state of the codeword using the error vector 210.

Using the identified match or mismatch states and the reliability information 222, the controller 115 can select an initial bit-flipping threshold of the set of initial bit-flipping thresholds for one or more bits of the originally read codeword. The selected initial bit-flipping threshold for a bit of the originally read codeword can be compared with its computed PC violation(s) to determine whether that bit should be flipped. By way of example, the initial set of bit-flipping thresholds can include a first, second, third, and fourth initial bit-flipping threshold, such as disclosed herein. The reliability enabled hard information decoder 208 applies one or more of the initial first, second, third, and fourth bit-flipping thresholds during the first decoding iteration of the Y decoding iterations, and the adaptive bit-flipping thresholds during remaining iterations of the Y decoding iterations until a second stopping condition is met (e.g., all check nodes are satisfied corresponding to an error-free codeword or a maximum number of iterations have been reached).

At block 314, the controller 115 determines if the second stop condition has been met. If the hard data 202 was successfully decoded (shown as "YES" in FIG. 3) so that the corrected data 204 can be provided, the method 300 proceeds to block 416 from block 314. At block 316, the controller 115 provides data embedded in the corrected data 204, referred to as requested or user data, to the host system 120 of FIG. 1. If the hard data 202 was not successfully decoded (shown as "NO" in FIG. 3), the method 300 proceeds to block 318 from block 314. At block 318, the controller 115 initiates the soft information decoder 206 to decode the hard data 202 using the computed soft information 214 over Z decoding iterations during a third decoding process in an attempt to correct bit errors. The soft information decoder 206 iteratively decodes over the Z decoding iterations until a third stop condition is met (e.g., all check nodes are satisfied or a maximum number of iterations have been reached). A number of decoding iterations implemented by the soft information decoder 206 during the third decoding process can be greater than a number of decoding operations implemented by the soft information decoder 206 during the first decoding process.

At block 320, the controller 115 determines if the third stop condition has been met. If the hard data 202 was successfully decoded (shown as "YES" in FIG. 3), the method 300 proceeds to block 316 from block 320. At block 316, the controller 115 provides the user data of the corrected data 204 to the host system 120 of FIG. 1. In some instances, if the hard data 202 was not successfully decoded (shown as "NO" in FIG. 3), the method 300 proceeds back to block 302 from block 320. At block 302, in response to the hard data 202 not being successfully decoded, the controller 115 can trigger a retransmission request so that the memory device 130 or the memory device 140 resends the stored codeword and the method 300 can proceed to block 304 and repeat the method 300 of FIG. 3.

Figure 4:
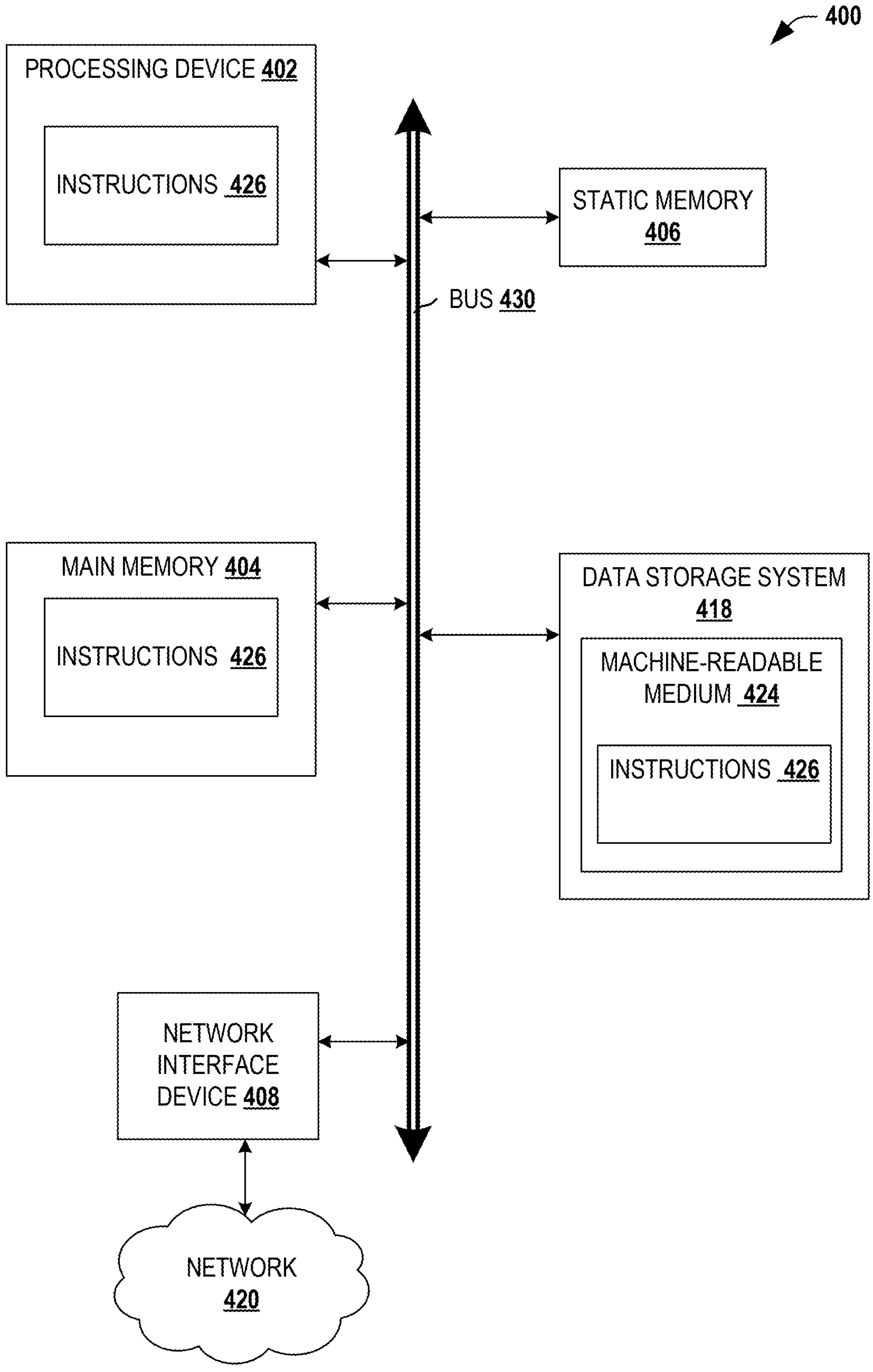
FIG. 4 illustrates an example of a computer system (a machine) in which examples of the present description may operate.

FIG. 4 illustrates an example machine of a computer system 400 (a machine) within which a set of instructions, for causing the machine to perform any one or more of the methodologies discussed herein, can be executed. In some examples, the computer system 400 corresponds to a host system (e.g., the host system 120 of FIG. 1) that includes, is coupled to, or utilizes a memory sub-system (e.g., the memory sub-system 110 of FIG. 1) or is used to perform the operations of a controller (e.g., to execute an operating system to perform operations corresponding to error corrector 113 of FIG. 1). In other examples, the machine is connected (e.g., networked) to other machines in a LAN, an intranet, an extranet and/or the Internet. In various examples, the machine operates in the capacity of a server or a client machine in client-server network environment, as a peer machine in a peer-to-peer (or distributed) network environment or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge or any machine capable of executing a set of instructions (sequential or otherwise) that specify actions to be taken by that machine. In other examples, the machine may be a computer within an automotive, a data center, a smart factory or other industrial application. Further, while a single machine is illustrated, the term "machine" shall also be taken to include any collection of machines that individually or jointly execute a set (or multiple sets) of instructions to perform the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM) or other non-transitory computer-readable media) and a data storage system 418, which communicate with each other via a bus 430.

The processing device 402 represents one or more general-purpose processing devices such as a microprocessor, a central processing unit, etc. More particularly, the processing device 402 can be a complex instruction set computing (CISC) microprocessor, reduced instruction set computing (RISC) microprocessor, very long instruction word (VLIW) microprocessor or a processor implementing other instruction sets or processors implementing a combination of instruction sets. In some examples, the processing device 402 is implemented with a special-purpose processing devices such as an application specific integrated circuit (ASIC), a field programmable gate array (FPGA), a digital signal processor (DSP), network processor, etc. The processing device 402 is configured to execute instructions 426 for performing the operations discussed herein. In some examples, the computer system 400 includes a network interface device 408 to communicate over the network 420.

The data storage system 418 includes a machine-readable storage medium 424 (also known as a computer-readable medium) that stores sets of instructions 426 or software for executing the methodologies and/or functions described herein. The machine-readable storage medium 424 is a non-transitory medium. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418 and/or main memory 404 can correspond to the memory sub-system 110 of FIG. 1. Accordingly, the machine-readable storage medium 424, the data storage system 418 and/or the main memory 404 are examples of non-transitory computer-readable media.

In some examples, the instructions 426 include instructions to implement functionality corresponding to the error corrector 113 of FIG. 1. While the machine-readable storage medium 424 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that causes the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here and generally conceived to be a self-consistent sequence of operations leading to a desired result. The operations are those requiring physical manipulations of physical quantities. Usually, though not necessarily, these quantities take the form of electrical or magnetic signals capable of being stored, combined, compared and otherwise manipulated. It has proven convenient at times, principally for reasons of common usage, to refer to these signals as bits, values, elements, symbols, characters, terms, numbers, etc.

It is noted, however, that all of these and similar terms are to be associated with the appropriate physical quantities and are merely convenient labels applied to these quantities. This description can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

This description also relates to an apparatus for performing the operations herein. This apparatus can be specially constructed for the intended purposes or this apparatus can include a general purpose computer selectively activated or reconfigured by a computer program stored in the computer. Such a computer program can be stored in a computer readable storage medium, such as, but not limited to, any type of disk including floppy disks, optical disks, CD-ROMs, magnetic-optical disks, read-only memories (ROMs), random access memories (RAMs), EPROMs, EEPROMs, magnetic or optical cards or any type of media suitable for storing electronic instructions, each coupled to a computer system bus.

The algorithms and displays presented herein are not inherently related to any particular computer or other apparatus. Various general purpose systems can be used with programs in accordance with the descriptions herein, or it can prove convenient to construct a more specialized apparatus to perform the method. In addition, the present disclosure is not described with reference to any particular programming language. It will be appreciated that a variety of programming languages can be used to implement the teachings of the disclosure as described herein.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term “includes” means includes but not limited to, the term “including” means including but not limited to. The term “based on” means “based at least in part on”. Additionally, where the disclosure or claims recite “a,” “an,” “a first” or “another” element, or the equivalent thereof, it should be interpreted to include one or more than one such element, neither requiring nor excluding two or more such elements.

What is claimed is:

1. A method for decoding data in a memory device, comprising:

performing, by a controller, a read operation to receive hard data from the memory device, wherein the hard data comprises a set of bits, wherein each bit of the hard data is determined as a binary value based on a read of the memory device using a fixed voltage threshold;

mapping, by the controller, each bit of the hard data to a respective log-likelihood ratio (LLR) value based on a binary state of that bit using a bit-to-LLR mapping to provide soft information comprising the LLR values;

decoding, by the controller, using a first decoder for a first number of decoding iterations, wherein the first decoder is initialized with the LLR values of the soft information as initial variable node messages and applies an iterative message-passing algorithm across the first number of decoding iterations to update the variable node messages based on parity check constraints;

generating, by the controller, an error vector indicating which bits of the hard data have been flipped by the first decoder based on a current state of a codeword for a respective decoding iteration of the first number of decoding iterations;

generating, by the controller, bit reliability information indicating a reliability of each bit in the current state of the codeword;

decoding, by the controller, using a second decoder to correct errors in the hard data for a second number of decoding iterations based on the error vector and the bit reliability information; and providing, by the controller, corrected data in response to correcting the errors in the hard data.

2. The method of claim 1, wherein the respective decoding iteration is a last decoding iteration of the first number of decoding iterations, the method further comprising determining the current state of the codeword based on reliability values for bits of the current state of the codeword from the last decoding iteration.

3. The method of claim 2, further comprising comparing the codeword to an originally read codeword to provide the error vector.

4. The method of claim 2, further comprising:

evaluating the reliability values relative to a threshold to determine a reliability of each bit in the codeword; and providing the bit reliability information in response to the evaluating.

5. The method of claim 1, wherein the second decoder applies an initial set of bit-flipping thresholds during a first decoding iteration of the second number of decoding iterations and one or more sets of adaptive bit-flipping thresholds during remaining decoding iterations of the second number of decoding iterations to correct the errors in the hard data until a stop condition.

6. The method of claim 5, wherein the initial set of bit-flipping thresholds includes a first bit-flipping threshold that is used for a bit in an originally read codeword corresponding to the hard data having a match state and identified as weak and a second bit-flipping threshold that is used for a bit in the originally read codeword having a match state and identified as strong.

7. The method of claim 6, wherein the initial set of bit-flipping thresholds further includes a third bit-flipping threshold that is used for a bit in the originally read codeword having a mismatch state and identified as weak and a fourth bit-flipping threshold that is used for a bit in the originally read codeword having the mismatch state and identified as strong.

8. The method of claim 1, further comprising determining, by the controller, whether the hard data was successfully decoded by the second decoder.

9. The method of claim 7, wherein the hard data corresponds to a codeword and the read operation is a first read operation, the method further comprising:

performing, by the controller, a second read operation to receive additional information from the memory device;

converting, by the controller, the received additional information to provide new soft information; and decoding, by the controller, the received additional information using a soft information decoder.

10. The method of claim 8, further comprising, in response to determining that the hard data was not successfully decoded by the second decoder, decoding, by the controller, using the first decoder to correct the errors in the hard data for a third number of decoding iterations until a stop condition.

11. The method of claim 10, further comprising determining, by the controller, whether the hard data was successfully decoded by the first decoder in response to the stop condition.

12. The method of claim 1, wherein the first decoder uses an algorithm that can aid the second decoder.

13. The method of claim 1, wherein the memory device is a Not-AND (NAND) memory device.

14. A system for decoding data in a memory device, comprising:

a memory device;

a processing device coupled to the memory device, the processing device to perform operations comprising:

mapping each bit of hard data, received from the memory device and corresponding to a codeword stored in the memory device, wherein each bit is determined as a binary value based on a read operation using a fixed voltage threshold, to a respective log-likelihood ratio (LLR) value based on a binary state of that bit using a bit-to-LLR mapping to provide soft information comprising the LLR values; and implementing a two stage decoding process to correct errors in the codeword to provide corrected data, wherein:

during a first stage of the two stage decoding process using a first decoder, the first decoder is initialized with the LLR values of the soft information as initial variable node messages and applies an iterative message-passing algorithm across a first number of decoding iterations to update the variable node messages based on parity check constraints, to provide an error vector and bit reliability information; and during a second stage of the two stage decoding process using a second decoder, the errors are corrected in the hard data based on the error vector and the bit reliability information.

15. The system of claim 14, wherein the second decoder applies an initial set of bit-flipping thresholds during a first decoding iteration and one or more sets of adaptive bit-flipping thresholds during remaining decoding iterations of the second stage of the two stage decoding process to correct the errors in the data until a stop condition.

16. The system of claim 14, wherein the memory device is a Not-AND (NAND) memory device.

17. A non-transitory computer-readable storage medium comprising instructions that, when executed by a processing device, cause the processing device to perform operations comprising:

performing a read operation to receive hard data from a memory device, wherein the hard data comprises a set of bits, wherein each bit of the hard data is determined as a binary value based on the read operation using a fixed voltage threshold;

mapping each bit of the hard data to a respective log-likelihood ratio (LLR) value based on a binary state of that bit using a bit-to-LLR mapping to provide soft information comprising the LLR values, wherein the hard data corresponds to a codeword stored in the memory device;

decoding using a first decoder for a first number of decoding iterations, wherein the first decoder is initialized with the LLR values of the soft information as initial variable node messages and applies an iterative message-passing algorithm across the first number of decoding iterations to update the variable node messages based on parity check constraints;

generating an error vector indicating which bits of the hard data have been flipped by the first decoder based on a current state of a codeword for a respective decoding iteration of the first number of decoding iterations;

generating bit reliability information indicating a reliability of each bit in the current state of the codeword;

decoding using a second decoder to correct errors in the hard data for a second number of decoding iterations based on the error vector and the bit reliability information; and providing corrected data in response to correcting the errors in the hard data.

18. The non-transitory computer-readable storage medium of claim 17, wherein the operations performed by the processing device further comprise:

determining that the hard data was not successfully decoded by the second decoder; and decoding, using the first decoder to correct the errors in the hard data for a third number of decoding iterations.

19. The non-transitory computer-readable storage medium of claim 17, wherein the respective decoding iteration is a last decoding iteration of the first number of decoding iterations, the operations further comprising determining the current state of the codeword based on reliability values for bits of the current state of the codeword from the last decoding iteration.

20. The non-transitory computer-readable storage medium of claim 17, wherein the memory device is a Not-AND (NAND) memory device.

* * * * *